US008552911B2

(12) United States Patent
Ham

(10) Patent No.: US 8,552,911 B2
(45) Date of Patent: Oct. 8, 2013

(54) AUTOMATIC ELECTRONICALLY TUNED ELECTRICALLY SMALL TRANSMITTING ANTENNA SYSTEM

(76) Inventor: Ronald Edgar Ham, Austin, TX (US)

( * ) Notice: Subject to any disclaimer, the term of this patent is extended or adjusted under 35 U.S.C. 154(b) by 219 days.

(21) Appl. No.: 13/180,335

(22) Filed: Jul. 11, 2011

(65) Prior Publication Data

US 2013/0016018 A1 Jan. 17, 2013

(51) Int. Cl.
*H01Q 1/38* (2006.01)
*G01R 29/10* (2006.01)

(52) U.S. Cl.
USPC .................................... 343/700 MS; 343/703

(58) Field of Classification Search
USPC ................... 343/703, 700 MS; 455/117, 41.1
See application file for complete search history.

(56) References Cited

U.S. PATENT DOCUMENTS 5,808,415 A * 9/1998 Hopkins .................. 315/111.21
6,061,006 A * 5/2000 Hopkins ......................... 341/61
2006/0084397 A1* 4/2006 Turner et al. .................. 455/117
2010/0184371 A1* 7/2010 Cook et al. ................... 455/41.1

* cited by examiner

*Primary Examiner* — Huedung Mancuso

(57) ABSTRACT

In an automatic tuning system for a loop antenna having a single electronically variable reactance element, the reactive component sense of the antenna impedance is determined over a wide range of frequency. The electronically variable reactance component of the antenna is automatically minimized by a feedback loop driving a voltage variable capacitance until the reactive component of the antenna impedance is virtually zero and the antenna impedance is hence resistive. The adjustment of the electronically variable capacitance is by a variable high voltage power supply controlled by a feedback amplifier or by a high voltage feedback amplifier.

5 Claims, 1 Drawing Sheet

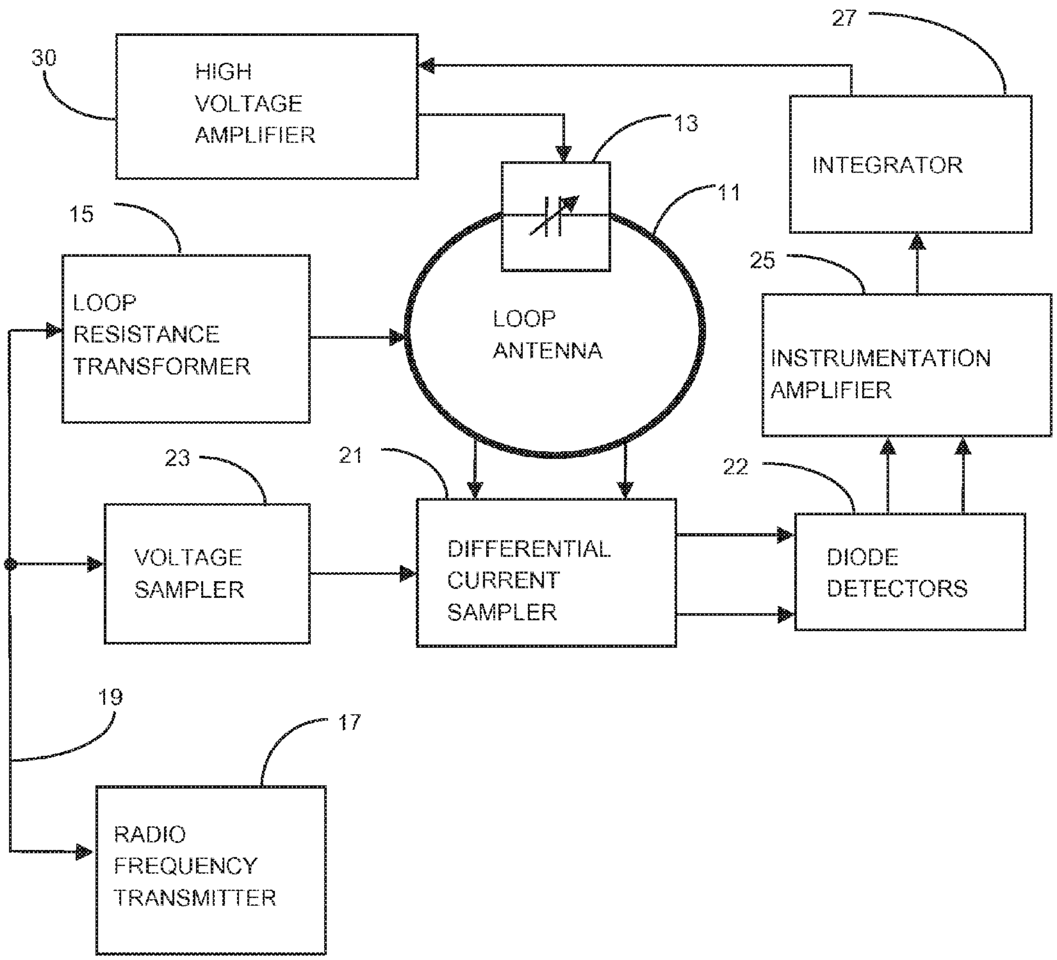
30
HIGH VOLTAGE AMPLIFIER
27
INTEGRATOR
13
11
15
LOOP RESISTANCE TRANSFORMER
LOOP ANTENNA
25
INSTRUMENTATION AMPLIFIER
23
21
22
VOLTAGE SAMPLER
DIFFERENTIAL CURRENT SAMPLER
DIODE DETECTORS
19
17
RADIO FREQUENCY TRANSMITTER

AUTOMATIC ELECTRONICALLY TUNED ELECTRICALLY SMALL TRANSMITTING ANTENNA SYSTEM

FIELD OF INVENTION

This invention relates to a system for automatically tuning an electrically small transmitting loop antenna and more particularly to a system for automatically tuning a portable antenna, man pack antenna, or an antenna embedded in a garment that radiates at a frequency with a wavelength much greater than the physical size of the antenna.

BACKGROUND OF THE INVENTION

Radiation of frequencies with wavelengths much larger than the space available for an antenna is often necessary. This results in the use of an electrically small antenna. An electrically small antenna has a very small bandwidth; therefore, small perturbations in the shape of the antenna or in surrounding object movement results in mistuning of the antenna to the extent that it does not radiate electromagnetic energy.

In transmitting antennas which have a narrow tuned bandwidth, it is important to tune the antenna to the transmitted frequency in order to achieve optimum performance in which maximum power is radiated. If the antenna environment changes during the period of a transmission, it is necessary to dynamically adjust the antenna and the antenna matching circuits.

Prior to the present invention, many systems for automatically tuning transmitting antennas were known. In some of these systems, the antenna is automatically tuned to the transmitted frequency using a forward and reflected power measurement. This method enables locating the measurement instruments remotely from the actual radiating element; however, it is difficult to determine if the antenna is above or below resonance. This is because the loop antenna, commonly used, normally returns an inductive reactance from both above and below resonance when only an antenna bandwidth or two in frequency away from the antenna resonance frequency. Additionally, the transmission line separating the antenna from the measurement point transforms the antenna impedance observed by the measuring circuit complicating the determination of the feedpoint impedance.

Prior antenna systems have also used a phase discriminator in the antenna feed line either at the transmitter or at the antenna. Again, as an electrically small loop antenna will not necessarily present a feedpoint capacitive reactance component when tuned off resonance, it is not possible to determine if the loop tuning capacitor should be increased or decreased to achieve antenna resonance.

Not being able to readily determine the radiating element complex impedance means that closing a simple null seeking feedback loop cannot be implemented for resonant frequency tuning and subsequent tracking with movement of the antenna or the surroundings of the antenna.

Additionally, prior art tuning of electrically small loop antennas is accomplished with a mechanical capacitor that is tuned by a rotating actuator such as a direct current motor or a stepping motor. This results in a system that is bulky, heavy and uses considerable primary power.

SUMMARY OF THE INVENTION

Technical Problem

Radiation of electromagnetic energy from an electrically small antenna is difficult because the bandwidth over which the antenna has a resistive radiation component is extremely small and the radiation resistance and center frequency varies with slight changes in the antenna position, minor loop distortion and changes in the surroundings.

The primary purpose of this invention is to facilitate automatic initial tuning and keeping an electrically small antenna worn on a man's body tuned to the resonant frequency, even with normal body motion changing the terminal impedance of the untuned antenna. The logical extension of this concept is to enable the automatic tuning of an electrically small antenna in any changing physical environment.

A loop antenna is used for this application because a counterpoise is not required for a radiating current distribution. To feed power to a loop, either two points must be tapped on the circumference, constituting an inductive auto-transformer, or a transformer core must encompass the loop at a point on the circumference to inductively transform the real impedance to that of the driving radio frequency transmitter. Either method yields an inductive feedpoint impedance at frequencies well below resonance. Additionally, an inductive feedpoint impedance is also presented at frequencies well above the antenna resonance. This means that it is not possible with a feedpoint measurement to determine if a tunable reactive component intended to resonate the antenna must be increased or decreased in value.

It is, however, possible to track small changes in the antenna impedance caused by antenna movement or movement of the near field surroundings of the antenna with a feedpoint measurement, but only over a bandwidth comparable to that of the very narrow bandwidth of the antenna. This makes practical application of this technique difficult and limited.

Another problem with constructing a continuously tunable system is the lack of availability of a voltage variable reactance that can operate at the currents and voltages incurred in a resonant transmitting loop antenna. At power levels of 10 watts it is not uncommon to create voltages across a tuning capacitor of two thousand zero-to-peak volts.

Solution to Problem

If the current within the loop antenna, not the feedpoint terminal current, is compared to the feedpoint terminal voltage, a true monotonic indication of the center frequency of the loop is obtained, which according to the invention can be used as a control signal in an analog or digital servo loop. This is accomplished, according to an embodiment of the invention, with a differential current transformer whose reference voltage is modulated by the addition of a sample of the feedpoint voltage. The differential current transformer outputs shall exhibit a shift of plus and minus ninety degrees from the sampled current and these waveforms shift further in phase relative to the feedpoint voltage as the load impedance changes. A useful property of this preferred embodiment is that the two current waveforms comprising the differential transformer outputs shall have unequal amplitudes if the load is not resistive. According to an embodiment of the invention, these two waveforms are then coupled to matched diode detectors to obtain detector output voltages proportional to their respective detector input magnitudes. When the low frequency components of the diode detector outputs are equal, the loop is at resonance with the applied radio frequency power. When these components are unequal, a control error signal is produced with the correct polarity, to enable either an analog or digital control loop to monotonically, continuously and automatically tune a variable capacitance while the loop reaches and maintains a resonance.

Electrically Tuned Capacitor

Varactors or electrically tuned semiconductor capacitors are seldom if ever used in transmitting antennas because high Q antennas produce a very large voltage across a tuning capacitor, and few diodes that are marketed as varactors can operate at these voltage levels. The peak voltage across an electrically variable capacitance diode is the sum of the direct current bias voltage and the peak value of the radio frequency voltage generated across the diode in the resonant circuit.

All p-n diode junctions display a change in junction capacitance as a reverse voltage is applied. The reason for this is the increase in the width of the junction region that is depleted of carriers as the reverse voltage increases. The doping profile of the junction is often varied to change the relationship between the applied reverse voltage and the capacitance of the junction.

High voltage power diodes have very wide n and p layers so that the layers are fully depleted only at the maximum operating voltage; therefore, the application of a direct current bias voltage determines the effective capacitance of the junction, and the depleted region, varying at the applied radio frequency rate, changes the remainder of the junction between current conducting and depleted states. This means that the diode region outside the bias depleted volume becomes a lossy conductor. The resistance that this adds to the circuit is generally not negligible, but the technique does facilitate dynamic tuning of the antenna with some loss in radiation efficiency.

By combining the above tuning sensor and a high voltage power diode used as a voltage variable capacitance, a feedback loop is implemented. This loop automatically tunes the antenna to resonance, and will maintain the resonance condition even with moderate changes in the antenna characteristics concomitant with physical variations in the loop and the immediate surroundings of the loop.

If the antenna is to be dynamically tuned over a broad frequency range, the varactor must constitute a large part of the tuning capacitance and the antenna degradation due to the undepleted bulk resistance of the varactor will be considerable. If the range or perturbations are small, a shunt low loss capacitor can be used and the bulk resistance loss is decreased. If the instantaneous tuning range is relatively small but the overall tuning range is large, switched low loss capacitors can be placed across a small capacitance range tuning range varactor.

Advantageous Effects of Invention

This technique of implementing and tuning an electrically small antenna facilitates the radiation of low frequencies from a body that is very small compared to the radiated radio frequency wavelength. For example, the 7 MHz radio frequency has a nominal wavelength of 40 meters. This frequency of radiation propagates through complex building structures and even to and from caves. A man wearing the small antenna system disclosed in this invention can radiate this low frequency electromagnetic energy for purposes of communication and radio location. The wearer's body motion and the changing of his surroundings will not significantly disrupt the radiation of radio frequency energy.

BRIEF DESCRIPTION OF THE DRAWINGS

FIG. 1 schematically illustrates the automatic tuning system of the present invention.

DESCRIPTION OF CERTAIN EMBODIMENTS

In the system as shown in FIG. 1, a loop antenna 11 tuned by a voltage variable capacitor 13 is driven by a loop resistance transformer 15, typically a toroidal transformer, whose turns ratio is chosen to provide an optimum match to the loop antenna resistance at resonance. The loop resistance transformer 15 is fed by a feedline 19 from the radio frequency transmitter 17. The voltage across the feedline 19 is sampled by a resistive or reactive ratio voltage sampler 23. It is also possible for the sampled voltage to be derived by a tertiary winding on the loop resistance transformer 15. The current in the loop antenna 11 is sampled by a differential current sampler 21 consisting of a toroidal current transformer with two phase opposing outputs. The output from the voltage sampler 23 is vectorially summed with the outputs of the differential current sampler 21 to yield two output radio frequency voltages, that are of equal amplitude when the circuit is resistive and not equal when there is a reactive component in the circuit. These radio frequency voltages are reduced to the magnitude of the voltages by matched diode detectors 22. These detector output voltages are equal when the loop antenna 11 is tuned to resonance. The voltages are unequal in one sense when the loop antenna 11 is above resonance and unequal in the opposite sense when the loop antenna 11 is below resonance. The difference between these voltages is derived in the instrumentation amplifier 25. While the output of the instrumentation amplifier 25 is positive the integrator 27 output voltage increases at a rate determined by the integration constant of the integrator 27. When the difference voltage from the instrumentation amplifier 25 is negative the integrator 27 output voltage decreases at the integration constant rate. When the diode detector 22 output voltages are equal, the instrumentation amplifier 25 output voltage is zero so the output voltage of the integrator 27 remains constant. The output voltage from the integrator 27 is amplified by a high voltage amplifier 30 to supply the large voltages needed to vary the capacitance of the voltage variable capacitor 13 with a minimum amount of bulk semiconductor resistive loss. The voltage variable capacitor 13 is typically a differential high voltage silicon pn junction rectifier operated in the back biased varactor mode. Thus, when the output voltage of the instrumentation amplifier 25 indicates that the loop antenna 11 is tuned below resonance, the integrator increases the voltage to the voltage variable capacitor 13 causing a decrease in capacitance and an increase in the resonant frequency.

When the output voltage of the instrumentation amplifier 25 indicates the loop antenna 11 is tuned above resonance, the same process produces an increase in the capacitance of the voltage variable capacitor 13 and the resonance frequency is decreased. This process continues at a rate determined by the integration constant of the integrator 27 until a null voltage is obtained at the output of the instrumentation amplifier 25, indicating the loop antenna 11 is tuned to the frequency of the radio frequency transmitter 17.

When the resonant frequency of the loop antenna 11 is automatically adjusted to the frequency of the radio frequency transmitter 17, moderate perturbations in either the loop antenna 11 dimensions or in the environment of the loop antenna 11 will cause compensatory changes in the voltage variable capacitor 13 tuning voltage, causing the loop antenna 11 to maintain resonance and the system to continue radiating radio frequency electromagnetic energy with little or no interruption.

INDUSTRIAL APPLICABILITY

The primary application for this invention is to facilitate the radiation of radio frequencies from electrically small antennas carried on the person of firemen, emergency response personnel, miners and any other persons or object that must be tracked in structures that do not pass the radiation of the typically used higher radio frequencies.

Scaling up the frequencies used for the tracking of personnel in complex environments means that current antenna size in all radio frequency systems can be considerably reduced and the changing environment of these equipments can be accommodated by the automatic tracking of this antenna system. The energy of very high radio frequencies can then be radiated directly from printed circuit boards and even integrated circuit substrates.

REFERENCES CITED

U.S. PATENT DOCUMENTS

| | | | | |
|---|---|---|---|---|
| 5,225,847 | June 1993 | Roberts et al. | Automatic Antenna Tuning System | 343/745 |
| 3,209,358 | September 1965 | Relsenheld | Electronically Tunable Antenna | 343/745 |
| 2,874,274 | April 1955 | Adams et al. | Automatic Tuning System | 250/17 |
| 3,588,905 | June 1971 | Dunlavy, Jr. | Wide Range Tunable Transmitting Loop Antenna | 343/856 |
| 3,550,137 | December 1970 | Kuecken | Constant Impedance Loop Antenna | 343/744 |
| 3,381,222 | April 1968 | Gray | Radio Telephone with Automatically Tuned Loaded Antenna | 333/17.3 |
| 3,475,703 | October 1969 | Kennedy et al. | Coarse Step-Fine Tune Automatically Tunable Antenna | 343/745 |
| 3,778,731 | December 1973 | Oomen | Tuning Method for T-Network Couplers | 333/173 |
| 4,234,960 | November 1980 | Spilsbury et al. | Antenna Automatic Tuning Apparatus | 455/123 |
| 4,343,001 | August 1982 | Anderson et al. | Digitally Tuned Electrically Tuned Small Antenna | 343/745 |
| 4,356,458 | October 1982 | Armitage | Automatic Impedance Matching Apparatus | 333/17.3 |
| 4,380,767 | April 1983 | Goldstein et al. | Controlled Antenna Tuner | 343/745 |
| 4,493,112 | January 1985 | Bruene | Antenna Tuner Discriminator | 343/186 |
| 4,965,607 | October 1990 | Wilkins et al. | Antenna Coupler | 343/860 |

FOREIGN PATENT DOCUMENTS

| | | | | |
|---|---|---|---|---|
| WO8808645 | November 1988 | Wilkins et al. | Antenna Coupler | 455/123 |

What is claimed is:

1. An automatically tuned antenna system comprising a loop antenna having a variable capacitive reactance component;

a feedline connected to said antenna to apply a signal to said antenna system to be transmitted thereby and causing a voltage to be impressed across the input terminals to said loop antenna system and a current to be impressed in said loop antenna;

means, connected by electrical connection, to sample the input voltage impressed across the said input terminals to said loop antenna system;

means, connected by electrical connection, to sample said current impressed in said loop antenna;

means to compare the phase of said voltage impressed and said current impressed; and means to continuously and automatically vary the voltage applied to the voltage variable capacitive reactance causing the phase relationship between said voltage impressed and said loop current impressed to become zero or close to zero signifying antenna resonance and the maximum emission of the input radio frequency energy from said loop antenna.

2. An automatically tuned antenna system as recited in claim 1, wherein said antenna resonance is maintained automatically and continuously despite changes in the antenna dimensions, shape or surrounding environment.

3. An automatically tuned antenna system as recited in claim 1, wherein the means to sample the current impressed in the loop antenna comprises a differential current transformer, whereby the reference voltage of said transformer contains a sample of the voltage across the input terminals.

4. An automatically tuned antenna system as recited in claim 1, wherein the physical length of the loop antenna is selected to be significantly smaller than the wavelength of the signal to be transmitted.

5. An automatically tuned antenna system as recited in claim 1, wherein the variable capacitive reactance component is implemented as a varactor device in an integrated circuit.

* * * * *